United States Patent
Vancoille et al.

(10) Patent No.: US 11,437,217 B2
(45) Date of Patent: Sep. 6, 2022

(54) METHOD FOR PREPARING A SAMPLE FOR TRANSMISSION ELECTRON MICROSCOPY

(71) Applicant: IMEC VZW, Leuven (BE)

(72) Inventors: Eric Vancoille, Lubbeek (BE); Niels Bosman, Mechelen (BE); Patrick Carolan, Wilsele (BE)

(73) Assignee: IMEC VZW, Leuven (BE)

( * ) Notice: Subject to any disclaimer, the term of this patent is extended or adjusted under 35 U.S.C. 154(b) by 0 days.

(21) Appl. No.: 17/332,114

(22) Filed: May 27, 2021

(65) Prior Publication Data

US 2021/0391144 A1    Dec. 16, 2021

(30) Foreign Application Priority Data

Jun. 12, 2020  (EP) ..................... 20179637

(51) Int. Cl.
  *H01J 37/00*   (2006.01)
  *H01J 37/26*   (2006.01)
  *G01N 1/32*    (2006.01)

(52) U.S. Cl.
  CPC .............. *H01J 37/261* (2013.01); *G01N 1/32* (2013.01); *H01J 2237/262* (2013.01); *H01J 2237/2802* (2013.01)

(58) Field of Classification Search
  CPC .............. H01J 37/261; H01J 2237/262; H01J 2237/2802; H01J 37/3053; H01J 37/3178;
  (Continued)

(56) References Cited

U.S. PATENT DOCUMENTS 9,679,776 B2    6/2017 Waite et al.
10,504,689 B2  12/2019 Vystavěl et al.
(Continued)

FOREIGN PATENT DOCUMENTS

KR   20060079384 A    7/2006
WO    2008059070 A2   5/2008

OTHER PUBLICATIONS

Lau, et al ("Properties and applications of cobalt-based material produced by electron-beam-induced deposition" J. Vac. Sci. Tech. A 20, No. 4 (2002) 1295-1302) (Year: 2002).*
(Continued)

*Primary Examiner* — Michael Maskell
(74) *Attorney, Agent, or Firm* — McDonnell Boehnen Hulbert & Berghoff LLP

(57) ABSTRACT

A method for preparing a sample for transmission electron microscopy (TEM) comprises providing a substrate having a patterned area on its surface that is defined by a particular topography. A conformal layer of contrasting material is deposited on the topography by depositing a layer of the contrasting material on a local target area of the substrate, spaced apart from the patterned area via Electron Beam Induced Deposition (EBID). The deposition parameters, the thickness of the layer deposited in the target area, and the distance of the target area to the patterned area are selected so that a conformal layer of the contrasting material is formed on the topography of the patterned area. A protective layer is subsequently deposited. The protective layer does not damage the topography in the patterned area because the patterned area is protected by the conformal layer.

14 Claims, 3 Drawing Sheets

(58) Field of Classification Search
CPC .... G01N 1/32; G01N 1/2813; G01N 23/2202; G01N 1/28; G01N 23/04; G01N 23/22; C23C 16/045; C23C 16/06; C23C 16/487
USPC .......... 250/306, 307, 310, 311, 492.1–492.3
See application file for complete search history.

(56) References Cited

U.S. PATENT DOCUMENTS

| | | | |
|---|---|---|---|
| 2016/0093467 A1* | 3/2016 | Torikawa | H01J 37/3045 250/310 |
| 2017/0133220 A1 | 5/2017 | Routh, Jr. et al. | |
| 2018/0217033 A1 | 8/2018 | Yeates et al. | |
| 2018/0282870 A1 | 10/2018 | Torikawa | |

OTHER PUBLICATIONS

Extended European Search Report and Written Opinion, Application No. EP20179637.2, dated Nov. 3, 2020, 6 pages.

Lau, Y. M., P. C. Chee, J. T. L. Thong, and V. Ng. "Properties and applications of cobalt-based material produced by electron-beam-induced deposition." Journal of Vacuum Science & Technology A: Vacuum, Surfaces, and Films 20, No. 4 (2002): 1295-1302.

O'Hanlon, T. J., A. Bao, FC-P. Massabuau, M. J. Kappers, and R. A. Oliver. "Cross-shaped markers for the preparation of site-specific transmission electron microscopy lamellae using focused ion beam techniques." Ultramicroscopy 212 (2020): 112970.

An, Byeong-Seon, Yeon Ju Shin, Jae-Seon Ju, and Cheol-Woong Yang. "Transmission Electron Microscopy Specimen Preparation for Two Dimensional Material Using Electron Beam Induced Deposition of a Protective Layer in the Focused Ion Beam Method." Applied Microscopy 48, No. 4 (2018): 122-125.

Liebig, J. P., M. Göken, Gunther Richter, M. Mačković, T. Przybilla, E. Spiecker, O. N. Pierron, and B. Merle. "A flexible method for the preparation of thin film samples for in situ TEM characterization combining shadow-FIB milling and electron-beam-assisted etching." Ultramicroscopy 171 (2016): 82-88.

Diercks, David R., Brian P. Gorman, and Johannes JL Mulders. "Electron beam-induced deposition for atom probe tomography specimen capping layers." Microscopy and Microanalysis 23, No. 2 (2017): 321.

* cited by examiner

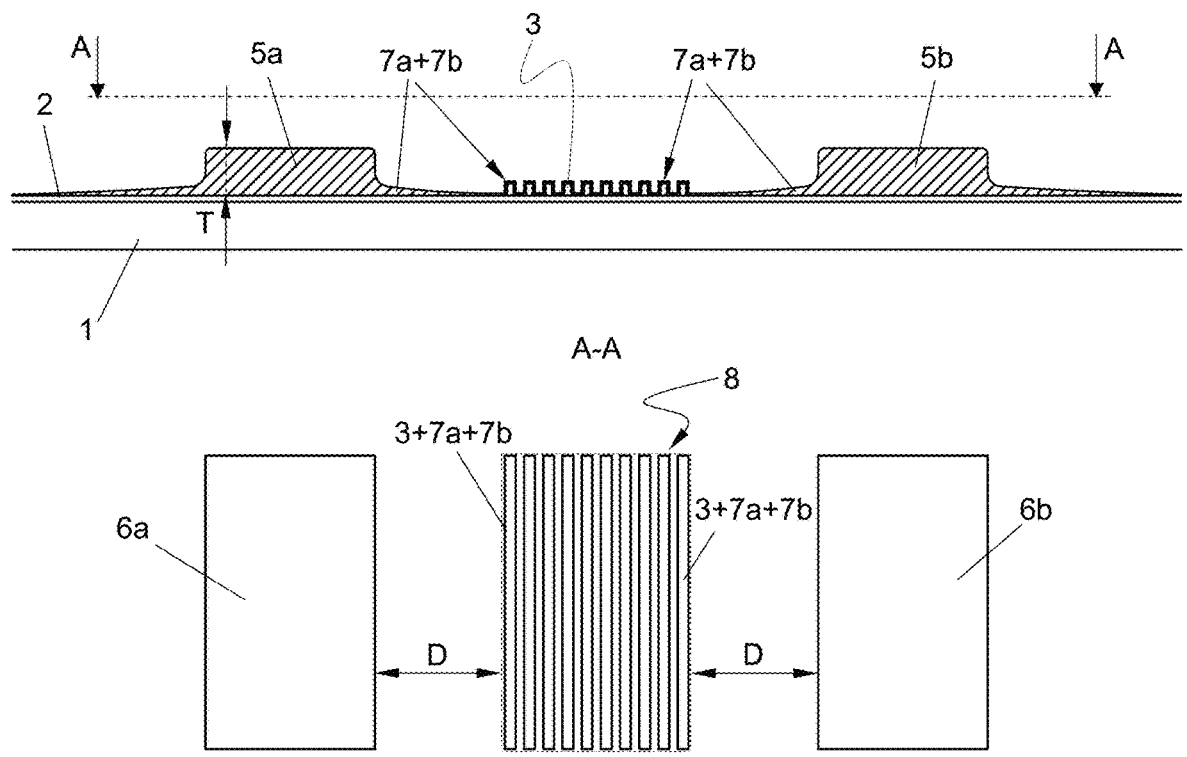
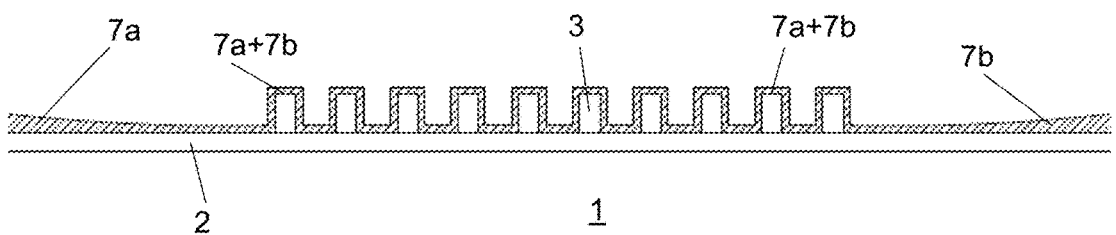
FIG. 5a
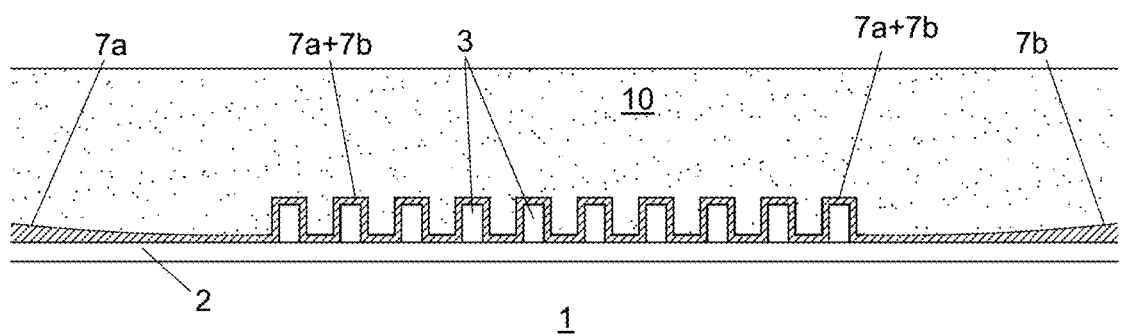
FIG. 5b

METHOD FOR PREPARING A SAMPLE FOR TRANSMISSION ELECTRON MICROSCOPY

CROSS-REFERENCE TO RELATED APPLICATIONS

The present application is a non-provisional patent application claiming priority to European Patent Application No. 20179637.2, filed Jun. 12, 2020, the contents of which are hereby incorporated by reference.

FIELD OF THE DISCLOSURE

The present application is related to the field of transmission electron microscopy (TEM), and in particular, to methods for preparing a TEM sample for visualizing nano-scaled structures, as produced in semiconductor processing.

BACKGROUND

Transmission electron microscopy (TEM) is used extensively in the semiconductor industry and facilitates viewing the finest details of transistors and memory structures down to the atomic level. One of the difficult steps in performing TEM relates to the preparation of a TEM sample. This is done in a focused ion beam milling (FIB) tool whereby a thin slice in the order of tens of nanometers is lifted out from a sample under investigation. The sample slice needs to be thin enough to exhibit electron transparency. In order to protect the structure itself from being milled away while preparing the thin slice, a mask and a protective layer are needed. This protective layer can be applied by a variety of methods. E.g., spin-on, physical vapor deposition, chemical vapor deposition, evaporation, or a combination of two or more of these methods applied sequentially. However, samples with a polymeric top surface, for example, comprising a patterned polymer photoresist layer, are prone to damage by any of the methods mentioned above and/or do not exhibit enough contrast with the protective layer to be distinguished during TEM observations. Depositing an additional contrasting layer by, for example, sputtering techniques is not an option in the case of vulnerable structures such as polymer resist lines or porous silicon structures because sputtering techniques tend to damage the structures.

SUMMARY

Aspects disclosed herein facilitate the preparation of samples that facilitate high-quality TEM analysis. For example, a substrate disclosed herein comprises a patterned area on its surface defined by a given topography of nano-sized features, for example, a set of parallel polymer resist lines. The substrate is configured to facilitate extraction of a TEM sample in the form of a slice of the substrate cut out transversally to the substrate surface. The TEM sample facilitates visualizing the topography by TEM. According to a method, a thin conformal layer of contrasting material is deposited on the topography by depositing a thicker layer of the contrasting material on a local target area of the substrate that is spaced apart from the patterned area, i.e., located at a non-zero distance from the patterned area. The material deposited on the target area is deposited by Electron Beam Induced Deposition (EBID), and in an example, without using a mask to cover the substrate surface outside the local target area. By careful selection of a) the thickness of the layer deposited in the target area and b) the distance of the target area to the patterned area, a conformal layer of the contrasting material is formed on the topography of the patterned area. In an example, the conformal layer follows the topography and does not fill spaces between adjacent features of the topography. This is followed by the deposition of the protective layer, which does not damage the topography in the patterned area as it is protected by the conformal layer. In an example, the TEM sample is processed further in subsequent operations, for example, by FIB. The contrast provided between the conformal contrasting layer and the protective layer facilitates the performance of high-quality TEM analysis.

An aspect of the disclosure relates to a method for preparing a TEM sample that facilitates the performance of TEM. The method comprises:
  providing a substrate comprising on its surface a patterned area comprising pattern features which define a topology,
  depositing a protective layer on the patterned area, and
  producing the TEM sample in the form of a thin slice of the substrate by removing material on either side of the slice, the slice being oriented transversally to at least a number of the features so as to visualize the features by TEM.

An example of the method further comprises, before the step of depositing the protective layer, producing a contrast layer on the topology by depositing a layer of contrasting material locally in at least one target area spaced apart from the patterned area. In an example, the local deposition is performed by Electron Beam Induced Deposition applied to the at least one target area in such a manner that a portion of the contrasting material is also deposited around the target area, thereby forming a conformal layer of the contrasting material on at least some of the features in the patterned area.

According to an embodiment, the features of the patterned area are formed of a polymer, and the contrasting material is a heavy metal, for example, Pt.

According to an example embodiment:
  the features are parallel lines defined by a given width, height, and pitch,
  the patterned area is an array of such lines, and
  the at least one target area is located to one side of the array, spaced apart from the array in a direction that is transversal to the lines.

According to an embodiment, the contrasting material is deposited in a single target area, and the thickness of the conformal layer decreases as a function of the distance to the target area.

According to an embodiment, the contrasting material is deposited in two or more target areas, and the conformal layer is at least partially formed by the addition of conformal layers formed as a consequence of the deposition of the contrasting material in the two or more target areas.

An aspect also relates to the use of EBID for depositing a layer of a contrasting material on a patterned area comprising pattern features that define a topology by depositing a layer of the contrasting material locally in at least one target area spaced apart from the patterned area, in such a manner that a portion of the contrasting material is also deposited around the target area, thereby forming a conformal layer of the contrasting material on at least some of the features in the patterned area. The conformal layer is suitable as a contrasting layer when producing a TEM sample of the patterned area.

BRIEF DESCRIPTION OF THE FIGURES

The above, as well as additional features, will be better understood through the following illustrative and non-limiting detailed description of example embodiments, with reference to the appended drawings.

FIG. 4 illustrates two local depositions are performed, one on either side of the array of resist lines, in accordance with an example embodiment.

FIGS. 5a and 5b illustrate a detail of the conformal layer on the array of resist lines before and after deposition of a spin-on carbon layer for the case of two Pt depositions, in accordance with an example embodiment.

All the figures are schematic, not necessarily to scale, and generally only show parts that are necessary to elucidate example embodiments, wherein other parts may be omitted or merely suggested.

DETAILED DESCRIPTION

Example embodiments will now be described more fully hereinafter with reference to the accompanying drawings. That which is encompassed by the claims may, however, be embodied in many different forms and should not be construed as limited to the embodiments set forth herein; rather, these embodiments are provided by way of example. Furthermore, like numbers refer to the same or similar elements or components throughout.

An example will be described for the case of a set of parallel polymer resist lines. Cited materials and processes that are known as such are mentioned only as examples and are not intended to limit the scope of the claims.

Figure 1:
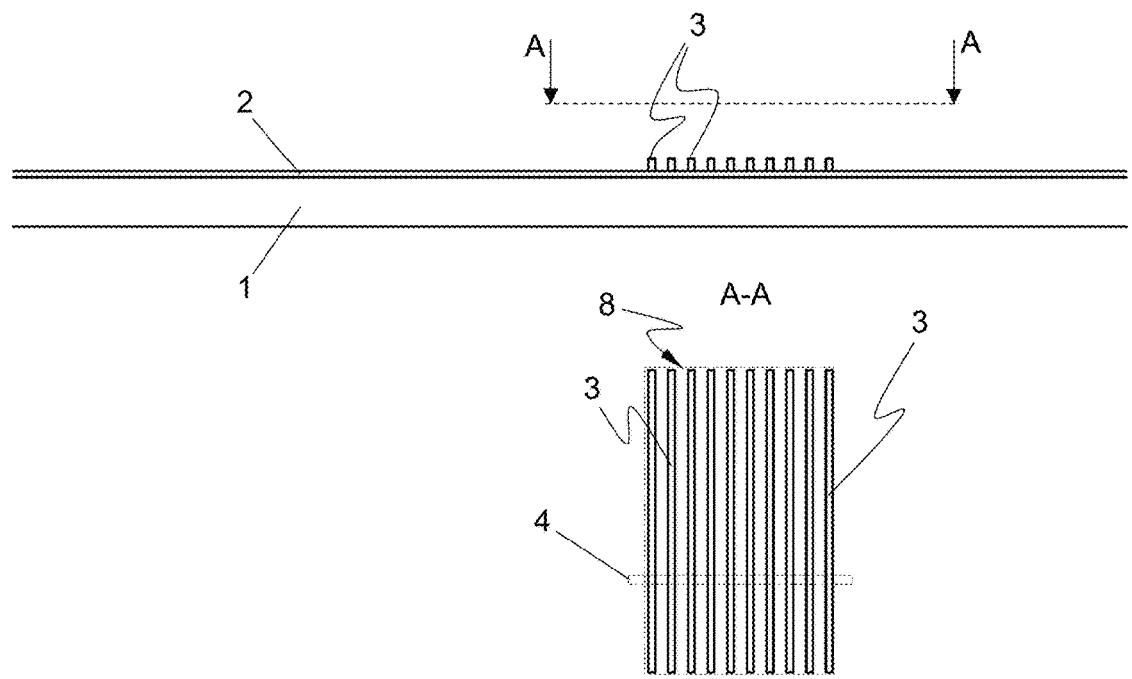
FIG. 1 shows a front view and a top view of an array of polymer resist lines on a substrate, in accordance with an example embodiment.

FIG. 1 shows a substrate 1. An example of the substrate 1 is a glass substrate with a layer of silicon 2 on its surface. A patterned area 8 is disposed on the Si layer. The patterned area 8 comprises an array of parallel polymer resist lines 3 that, in an example, are produced by a lithographic patterning technique. The width (measured in the plane of the drawing) and height of the lines 3 are on the order of nanometers, for example, between 10 and 20 nanometers. The pitch of the array of lines is of the same order of magnitude. The aim is obtaining a TEM sample that allows the verification of these dimensions. In order to do this, a protective spin-on carbon (SoC) layer is to be deposited on the resist lines 3, and a TEM sample of the substrate is to be produced in a focused ion beam (FIB) tool by milling away material on either side of a thin slice oriented in the direction perpendicular to the lines 3. An outline of the sample 4 is indicated in the top view of FIG. 1. According to an aspect, however, an additional step is performed prior to depositing the SoC layer.

Figure 2:
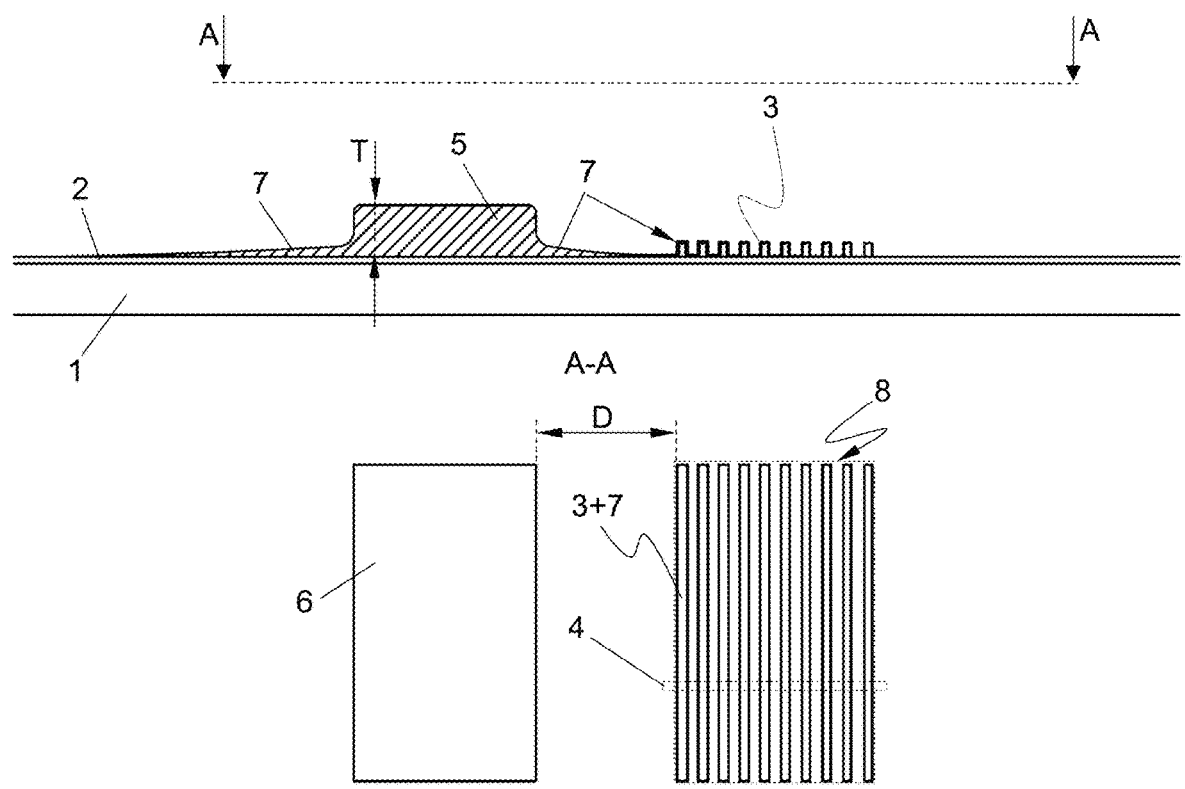
FIG. 2 illustrates the local Pt deposition and conformal Pt layer deposition on the substrate of FIG. 1, in accordance with an example embodiment.

As illustrated in FIG. 2, a layer 5 of platinum having a thickness T is deposited locally in a rectangular target area 6 to one side of the array of resist lines 3, spaced apart from the array by a distance D, the distance D extending in a transversal direction relative to the lines 3, in this case, perpendicular to the lines. The local deposition is performed by Electron Beam Induced Deposition (EBID), and in an example, is performed in the FIB tool that is to be used for producing the TEM sample. The EBID technique is known as such, and details of this technique are not described here. When the EBID deposition is limited to a given target area 6 that is located at a distance D from the patterned area 8 that comprises the lines 3, a thin layer 7 of the deposited material is also produced in a region surrounding the target area 6. The thin layer is a result of the generation of secondary and backscattered electrons in the polymer material of the lines 3 and in the deposited material itself. Careful selection of the distance D, the thickness T of the Pt in the target area 6, and the deposition parameters applied in the EBID process facilitates conformally forming the thin layer 7 on the resist lines 3, i.e., the layer follows the topography defined by the lines 3 and does not fill the spaces between two adjacent lines 3.

Figure 3A:
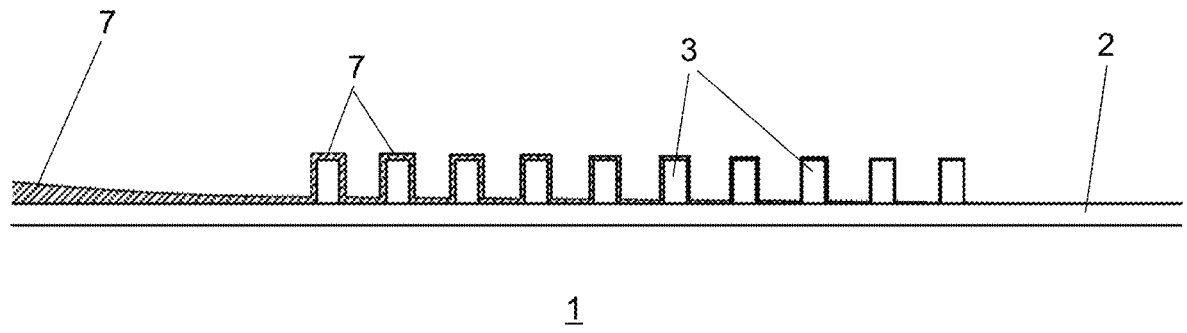
FIGS. 3a and 3b illustrate a detail of the conformal layer on the array of resist lines, before and after deposition of a spin-on carbon layer, for the case of a single Pt deposition to one side of the resist lines, in accordance with an example embodiment.

When the material of the layer 5/7 is not reactive with respect to the polymer, as is the case for Pt, the conformal layer 7 does not damage the polymer lines 3, given the fact that the conformal layer 7 is formed outside the area 6 that is directly affected by the EBID process. As seen in FIG. 2 and in more detail in FIG. 3a, the conformal layer 7 has a thickness of a few nanometers, which decreases gradually as a function of the distance from the target area 6. Preferably, the distance D and the thickness T are chosen as a function of the dimensions of the array of lines 3 (height and width of the lines and pitch of the array), so that all the lines 3 of the array receive a contrast layer that is detectable by TEM. The parameters D and T and other deposition parameters may, therefore, depend on the exact dimensions of the patterned area 8 and of the features within the area. A limited number of trials is, however, sufficient for finding a suitable set of deposition parameters.

Figure 3B:
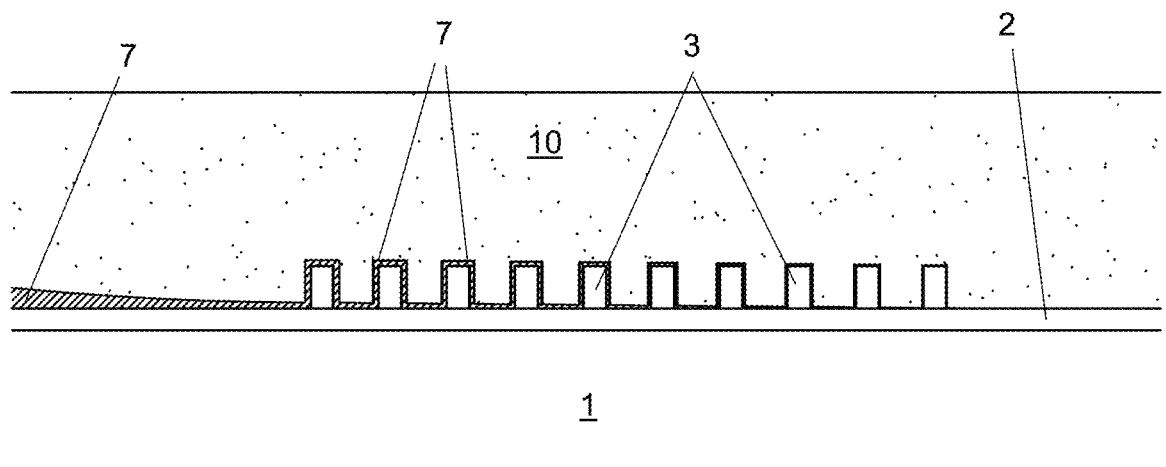

As seen in FIG. 3b, a layer 10 of spin-on carbon (SoC) is then deposited on top of the Pt layer 7 to serve as the protective layer required during the TEM sample processing. The protective layer could be another suitable material known in the art, applied by any technique known for this purpose. The substrate is then moved back to the FIB tool for producing the TEM sample 4. The TEM image obtainable from the sample 4 corresponds to the section view shown in FIG. 3b. Even though the conformal layer 7 does not have a constant thickness, the conformal layer 7 provides a clear contrast between the lines 3 and the SoC layer 10, and thereby permits the lines 3 to be clearly visualized in the TEM image so that the dimensions of the lines can be measured and/or verified. Furthermore, the Pt layer 7 protects the polymer lines 3 from any damage during the deposition of the SoC layer 10. In an example, the deposition by EBID is applied only to the target area 6, i.e., not directly to the area of interest 8, thereby avoiding possible damage to the polymer lines 3 caused by the high electron currents applied in the EBID process.

FIG. 4 shows an embodiment wherein local Pt layers 5a and 5b of equal thickness T are deposited on both sides of the patterned area 8 comprising the array of polymer resist lines 3, in two equal-sized rectangular target areas 6a and 6b, placed at equal distance D from the array. The layers 5a and 5b are applied sequentially, i.e., through deposition by EBID in area 6a followed by area 6b or vice versa. The decreasing thicknesses of the conformal Pt layers 7a and 7b resulting from the two Pt depositions now add up and form a contrast layer with a substantially constant thickness, as shown in the detail images in FIGS. 5a and 5b. The image obtained from the TEM sample 4 now resembles the view shown in FIG. 5b. The contrast layer 7a+7b has a substantially constant thickness across the array of resist lines 3.

However, by depositing two Pt layers 5a and 5b of lower thickness than in the example shown, or further away from the array of resist lines 3, the combined conformal layer 7a+7b could have a higher thickness on the outer lines than in the middle of the array, this lower thickness, however, being sufficient to provide the required contrast. It is also possible to deposit layer 5a at a different distance from the array 8 than the layer 5b, for example, if the available space for the target areas is not the same on both sides of the array. In that case, the thickness T of the layers 5a and 5b could be different in order to ensure that a conformal layer of suitable thickness is eventually formed on the lines 3. In some examples, more than two layers 5a, 5b, 5c, etc., could be deposited sequentially in more than two respective target areas 6a, 6b, 6c, etc., if the size and other characteristics of the patterned area would require this. The in-plane shape of the target 6 or areas 6a, 6b, etc., could be other than the rectangular shape illustrated in the drawings. If the contrast layer 7 (or 7a+7b+ . . . ) is needed only on some of the features in a sub-area of the patterned area 8, the thickness T and/or the distance D and possibly other parameters could be adapted so that the contrast layer 7 is at least deposited on the sub-area of the patterned area 8. The method allows a degree of flexibility as a function of the characteristics of the structure of which a TEM sample is required.

Numerical Example:

The following EBID parameters are suitable for obtaining a contrasting layer of Pt on an array of polymer resist lines like the array illustrated in the drawings, the width of the lines, measured perpendicular to the longitudinal direction of the lines, being about 14 nm, the height about 15 nm, the pitch about 30 nm.

Primary beam energy: 5 keV
Current through aperture: 1.6 nA
Time of deposition: 60 s
Distance D (FIG. 2): 2 to 4 μm
Temperature: room temperature
Thickness T (FIG. 2): 2 to 20 nm
Examples of the in-plane dimensions of the Pt target areas 6 are 0.3 μm×2 μm. The in-plane dimensions may be chosen depending on local structure features.

The aspects disclosed herein are not limited to any of the materials cited above. The aspects are primarily useful for producing TEM samples comprising features of a vulnerable material such as polymer or porous silicon, and/or a material that shows little or no contrast with the protective layer required for the TEM sample preparation. The contrast layer may be formed of any material that is not reactive with the material of the features that are to be imaged by TEM. For the imaging of polymer structures, other heavy metals besides Pt are suitable as materials for the contrast layer, e.g., W, Hf, Mo, Au, Ir, etc., which can be deposited in a FIB instrument using an appropriate chemical precursor and the EBID mode.

The structure that is to be imaged may be any patterned structure defined by a given topography. The aspects disclosed herein are applicable, for example, to all scaled structures and stacks used in patterning where the top is a resist, or a structure with complex layers of resist as used in DSA (Directed Self-Assembly), SADP/SAQP (Self-Aligned Double and Quadruple Patterning) methods, or a structure where analysis of a polymeric activation layer for selective deposition is required.

While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different dependent claims does not indicate that a combination of these measures or features cannot be used. In the claims, the word "comprising" does not exclude other elements or steps, and the indefinite article "a" or "an" does not exclude a plurality. Any reference signs in the claims should not be construed as limiting the scope.

What is claimed is:

1. A method for preparing a sample for transmission electron microscopy (TEM) comprises:
   providing a substrate comprising a patterned area on its surface that comprises patterned features that defines a topology;
   depositing a layer of contrasting material in at least one target area that is spaced apart from the patterned area to thereby produce a contrast layer on the topology, wherein depositing of the layer comprises applying Electron Beam Induced Deposition (EBID) to the at least one target area in such a manner that a portion of the contrasting material is also deposited around the target area to thereby form a conformal layer of the contrasting material on at least some of the patterned features of the patterned area;
   depositing a protective layer on the patterned area; and
   producing the sample in the form of a thin slice of the substrate by removing material on either side of the slice, the slice being oriented transversally to at least a number of the patterned features, so as to visualize the patterned features by TEM.

2. The method according to claim 1, wherein the EBID is only applied to the at least one target area.

3. The method according to claim 1, wherein depositing of the layer of contrasting material is performed before depositing the protective layer.

4. The method according to claim 1, wherein the patterned features of the patterned area are formed from a material that comprises a polymer and wherein the contrasting material is a heavy metal.

5. The method according to claim 4, wherein the heavy metal comprises Pt.

6. The method according to claim 1, wherein:
   the patterned features corresponds to an array of parallel lines, wherein each line has a particular width, height, and pitch; and
   the at least one target area is located to one side of the array and is spaced apart from the array in a direction that is transversal to the lines.

7. The method according to claim 1, wherein the contrasting material is deposited in a single target area, and wherein a thickness of the conformal layer decreases as a function of a distance to the target area.

8. The method according to claim 1, wherein the contrasting material is deposited in two or more target areas and wherein the conformal layer is at least partially formed by addition of conformal layers formed as a consequence of the deposition of the contrasting material in the two or more target areas.

9. A sample that facilitates performance of transmission electron microscopy (TEM) comprises:
   a substrate comprising a patterned area on its surface that comprises a patterned features that defines a topology;
   a contrasting layer applied on at least some of the patterned features, wherein the contrasting layer corresponds to a conformal layer that comprises a contrasting material, wherein the contrasting material is applied on the substrate via Electron Beam Induced Deposition (EBID) in at least one target area that is spaced apart from the patterned area in such a manner that a portion of the contrasting material is also deposited around the target area to thereby produce the contrast layer on the topology; and a protective layer disposed on the patterned area.

10. The sample according to claim 9, wherein the patterned features of the patterned area are formed of a polymer and wherein the contrasting material is a heavy metal.

11. The sample according to claim 10, wherein the heavy metal comprises Pt.

12. The sample according to claim 9, wherein:

the patterned features corresponds to an array of parallel lines, wherein each line has a particular width, height, and pitch; and the at least one target area is located to one side of the array and is spaced apart from the array in a direction that is transversal to the lines.

13. The sample according to claim 9, wherein a thickness of the conformal layer decreases as a function of a distance to the target area.

14. The sample according to claim 9, wherein the contrasting material is deposited in two or more target areas and wherein the conformal layer is at least partially formed by addition of conformal layers formed as a consequence of the deposition of the contrasting material in the two or more target areas.

* * * * *